(12) United States Patent
Ootera

(10) Patent No.: US 6,787,874 B2
(45) Date of Patent: Sep. 7, 2004

(54) SEMICONDUCTOR DEVICE

(75) Inventor: Hiroki Ootera, Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/164,427

(22) Filed: Jun. 10, 2002

(65) Prior Publication Data

US 2003/0107061 A1 Jun. 12, 2003

(30) Foreign Application Priority Data

Dec. 6, 2001 (JP) ........................................ 2001-372227

(51) Int. Cl.[7] .............................................. H01L 29/00
(52) U.S. Cl. ....................... 257/499; 257/500; 257/501; 257/506; 257/510
(58) Field of Search ................................ 257/499, 500, 257/501, 506, 510

(56) References Cited

U.S. PATENT DOCUMENTS

| 3,343,256 | A | * | 9/1967 | Smith et al. | 257/499 |
| 3,801,949 | A | * | 4/1974 | Larrabee | 257/622 |
| 3,963,489 | A | * | 6/1976 | Cho | 257/499 |
| 4,238,278 | A |   | 12/1980 | Antipov | |
| 5,278,078 | A |   | 1/1994 | Kanebako et al. | |
| 5,298,450 | A |   | 3/1994 | Verret | |
| 5,453,713 | A | * | 9/1995 | Partovi et al. | 327/565 |
| 5,485,029 | A | * | 1/1996 | Crabbe et al. | 257/501 |
| 5,864,168 | A | * | 1/1999 | Nasserbakht | 257/500 |
| 2003/0107061 | A1 | * | 6/2003 | Ootera | 257/276 |

OTHER PUBLICATIONS

Kodate et al., "Suppression Of Substrate Crosstalk In Mixed–Signal Complementary MOS Circuits Using High–Resistivity SIMOX (Separation By IMplanted OXygen) Wafers)", Japanese Journal of Applied Physics, vol. 39, Part 1, No. 4B, Apr. 2000, pp. 2256–2260.

* cited by examiner

Primary Examiner—Mark V. Prenty
(74) Attorney, Agent, or Firm—Leydig, Voit & Mayer, Ltd.

(57) ABSTRACT

Noise-reduced semiconductor devices operating at a high frequency band greater than several GHz are disclosed. Also disclosed is a method for manufacturing such semiconductor devices. A trench penetrating through a semiconductor substrate surrounds a noise-generating circuit block and/or a noise-susceptible circuit block, in order to reduce noise propagation through the substrate. Noise-reduced semiconductor devices are fabricated with a conventional silicon wafer instead of an SOI (Silicon on Insulator) wafer, which is manufactured in a complicated process sequence.

8 Claims, 6 Drawing Sheets

US 6,787,874 B2

SEMICONDUCTOR DEVICE

BACKGROUND OF THE INVENTION

1. Field of the Invention

Generally, the present invention relates to a semiconductor device, and more particularly to an inexpensive semiconductor device which is improved so that noise propagation can be reduced.

The present invention also relates to a manufacturing method of such a semiconductor device.

2. Description of the Background Art

FIG. 12 is a sectional view of a conventional high frequency silicon semiconductor device. An oxide film layer 5 is formed in a silicon substrate 1. A trench isolation 6 is located on oxide film layer 5. A gate electrode 2 of a transistor is located on silicon substrate 1. Wires 3 are connected to the transistor. An interlayer insulating film 4 covers silicon substrate 1 in order to insulate the transistor and the wires.

Thus, the conventional high frequency silicon semiconductor device is fabricated with an SOI (Silicon on Insulator) wafer utilizing a silicon substrate as a base, and is also combined with an isolation technique such as a trench isolation, thereby attempting to reduce crosstalk noise. That is, there has a configuration that trench isolation 6 separates a circuit block which generates noise from a circuit block in which it is desired to suppress noise level to reduce noise propagating in silicon substrate 1.

Such a high frequency silicon semiconductor device is operated at a frequency band greater than several GHz for transmission and reception and is utilized in a cellular phone, a wireless local area network, other high rate communication equipment and the like.

The conventional high frequency silicon semiconductor device is configured as described above. Since the SOI substrate is manufactured through a complicated process sequence such as ion implantation, wafer bonding and wafer splitting, there is a demerit that the price is high in comparison with a conventional silicon substrate.

SUMMARY OF THE INVENTION

The present invention is made to solve the above described problem and an object thereof is to provide a high frequency silicon semiconductor device which is improved so as to be capable of manufacturing inexpensively.

Another object of the present invention is to provide a semiconductor device which is improved such that noise propagating in the silicon substrate can be reduced by means of an inexpensive method.

Still another object of the present invention is to provide a manufacturing method of such a semiconductor device.

A semiconductor device according to a first aspect of the present invention is provided with: a semiconductor substrate; a trench vertically penetrating through the semiconductor substrate; and a semiconductor element formed on the semiconductor substrate.

According to the present invention, a trench penetrating through the semiconductor substrate is provided, so that noise propagation via the semiconductor substrate can be reduced.

A method according to a second aspect of the present invention relates to a manufacturing method of a semiconductor device which has a semiconductor substrate through which a trench vertically penetrates is formed. First, a portion for forming the trench of the semiconductor substrate is downwardly excavated up to the middle of the substrate. An insulator is fully or partially embedded into the downwardly excavated portion. The portion for forming the trench of the semiconductor substrate is excavated from an opposite side of the substrate until the insulator appears.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

In the following, embodiments of the present invention will be described with reference to the drawings.

First Embodiment

Figure 1:
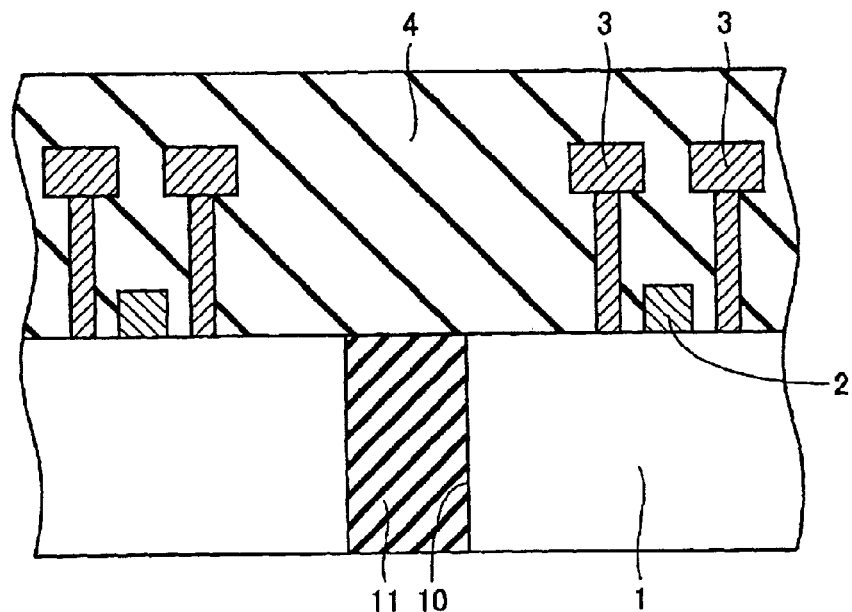
FIG. 1 is a sectional view of a high frequency silicon semiconductor device according to a first embodiment.

FIG. 1 is a sectional view of a high frequency silicon semiconductor device according to a first embodiment.

With reference to FIG. 1, a trench 10 penetrating through a silicon substrate 1 is provided in the substrate. An insulator 11 is embedded into trench 10. It is preferable that a thickness of silicon substrate 1 is adjusted from 30 μm to 50 μm. A gate electrode 2 of a transistor is formed on silicon substrate 1. Wires 3 are connected to the transistor. An insulating layer 4 is provided on silicon substrate 1 in order to insulate the transistor or between the wires. Trench 10 is provided so as to surround a circuit module which generates noise or a circuit module of which a noise level is desired to be lowered.

Trench 10 separates semiconductive silicon substrate 1 into two parts, so that noise propagation is suppressed. According to the present embodiment, the substrate may be a general silicon substrate and it is not necessary to use an expensive SOI substrate. Accordingly, a high frequency silicon semiconductor device which is improved so as to reduce noise propagation can be inexpensively obtained.

Note that a manufacturing method of such a semiconductor device will be described below.

Second Embodiment

With reference to FIG. 1, although trench 10 penetrating through silicon substrate 1 is embedded with insulator 11, the existence of such a solid insulator is not necessary and, in place of that, a hollow area may be provided. In this case, a step of embedding an insulator into trench 11 can be omitted, so that there is an advantage that the manufacturing process can be further simplified.

Third Embodiment

When a portion which generates noise and a portion of which the noise level is desired to be lowered exist at the same time within one semiconductor device, it is considered that noise should not be went out of noise generation source as a method of suppressing noise propagation.

Figure 2:
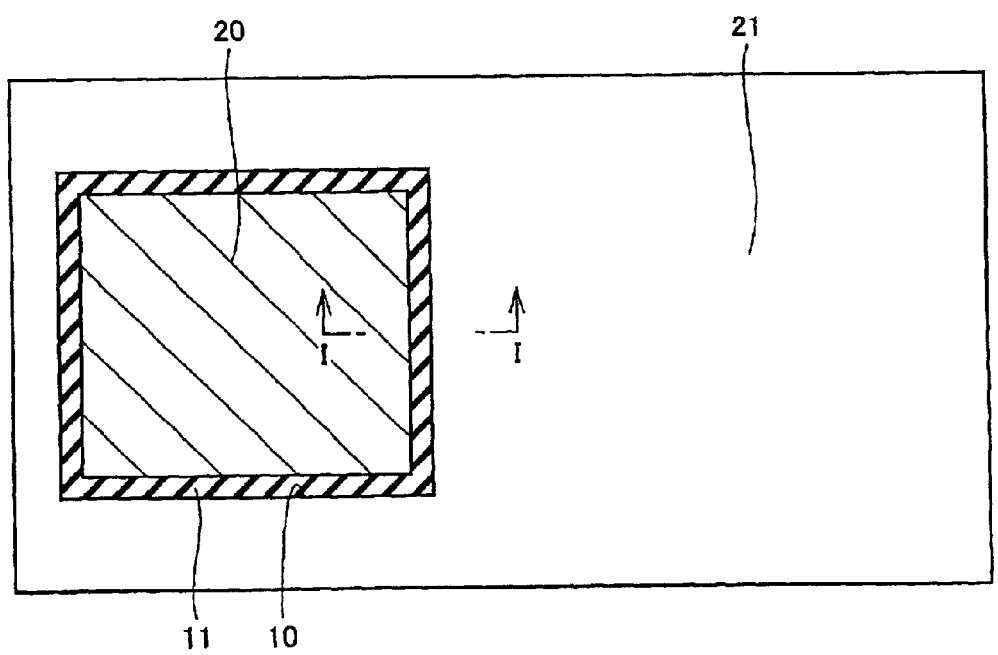
FIG. 2 is a plan view of a high frequency silicon semiconductor device according to a third embodiment.

FIG. 2 shows a plan view of a semiconductor device according to the present embodiment. A circuit block 20 which generates noise is surrounded by a trench 10 to reduce noise propagation to a circuit block 21 which is outside thereof and of which the noise level is desired to be lowered. A sectional view along line I—I in FIG. 2 is represented, for example, as the sectional view shown in FIG. 1.

Fourth Embodiment

Figure 3:
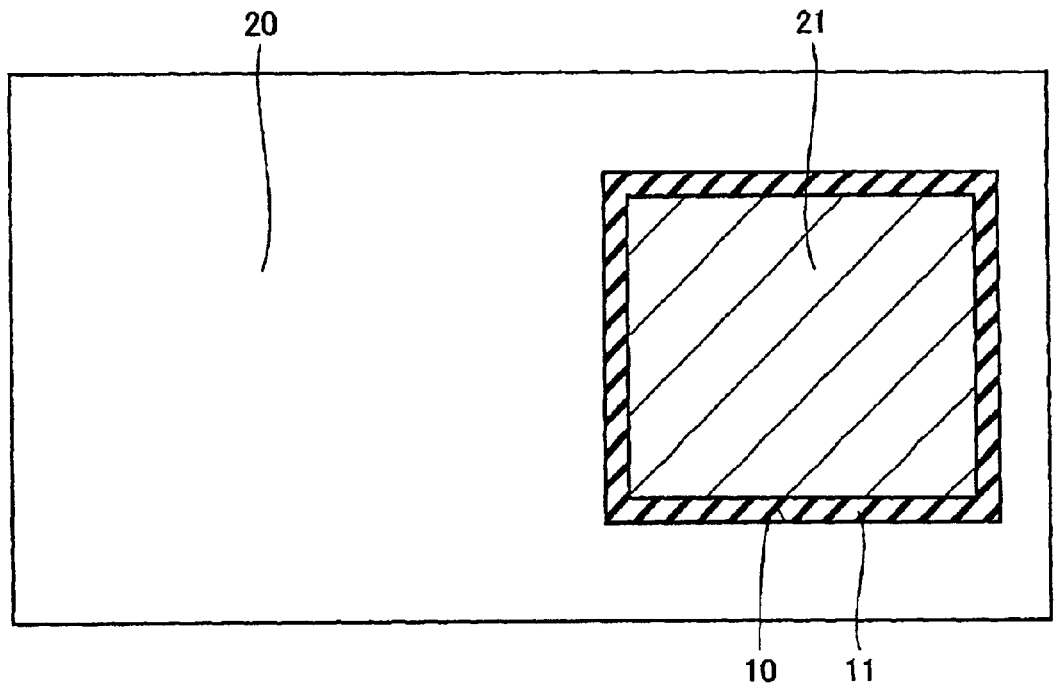
FIG. 3 is a plan view of a high frequency silicon semiconductor device according to a fourth embodiment.

FIG. 3 is a plan view of a high frequency silicon semiconductor device according to a fourth embodiment. A configuration that a circuit block 20 which is a noise generation source is surrounded by a trench 10 is adopted in the semiconductor device in FIG. 2. However, the present invention is not limited thereto, and noise reduction can be achieved, as shown in FIG. 3, by adopting a configuration that circuit block 21 of which the noise level is desired to be lowered is surrounded by trench 10.

Fifth Embodiment

In a case where an amount of generated noise is great or in a case where a low noise tolerance level setting is desired, a single trench, only, may be insufficient in some cases. In such a case, for example, plural trenches such as trenches 10a and 10b are aligned as shown in FIG. 4 (sectional view) and FIG. 5 (plan view) and, thereby further reducing the noise level.

Figure 4:
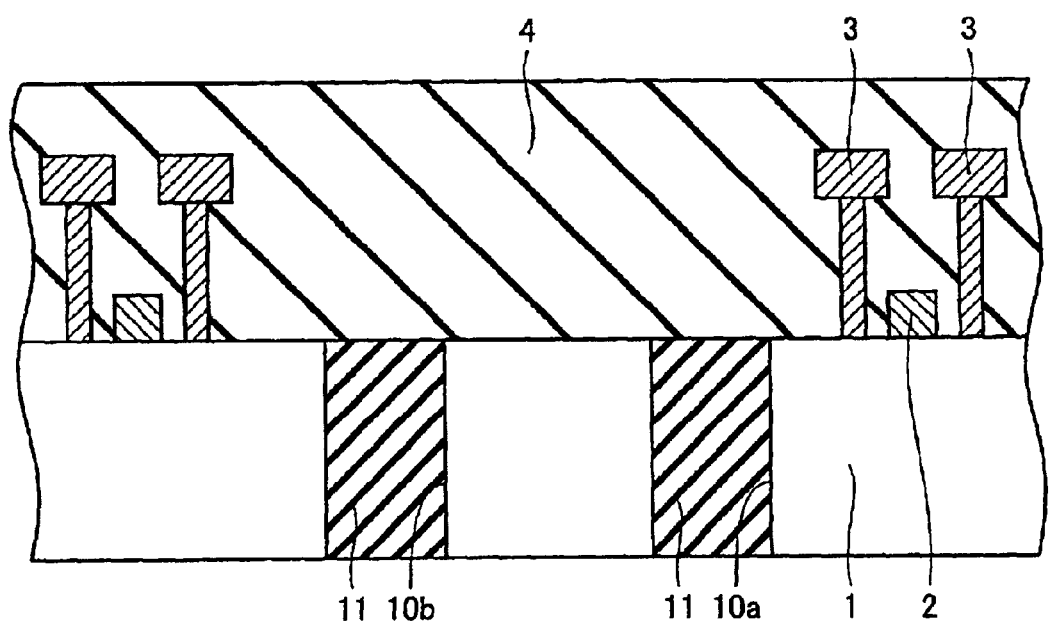
FIG. 4 is a sectional view of a high frequency silicon semiconductor device according to a fifth embodiment.
Figure 5:
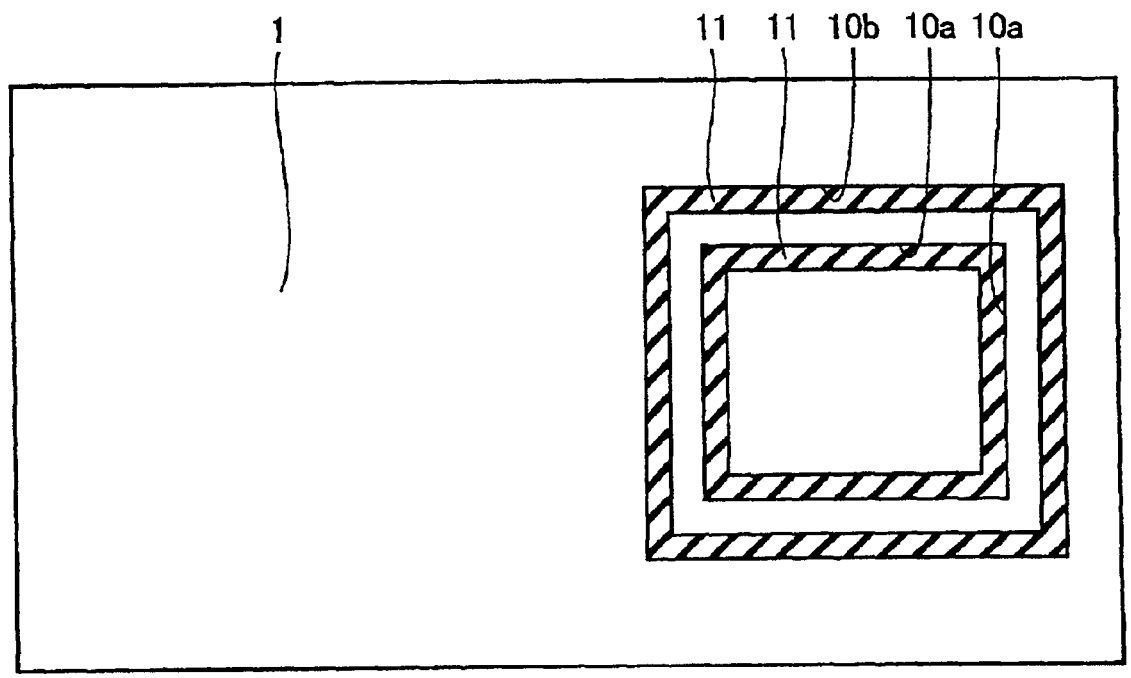
FIG. 5 is a plan view of the device shown in FIG. 4.

Note that a case of two trenches is shown in the device of FIGS. 4 and 5 and a greater effect can be obtained in the case that the number of trenches is increased.

Sixth Embodiment

FIGS. 6 to 9 are views showing a manufacturing method of a high frequency silicon semiconductor device according to a sixth embodiment.

Figure 6:
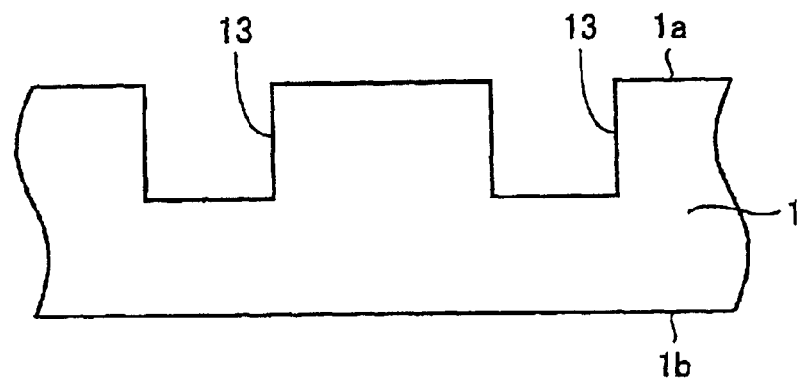
FIGS. 6 to 9 are sectional views of a semiconductor device in the order of first to fourth steps of a method of manufacturing a semiconductor device according to a sixth embodiment.

With reference to FIG. 6, a portion for forming a trench of a silicon substrate 1 is downwardly excavated up to the middle of the substrate to form a trench 13.

Figure 7:
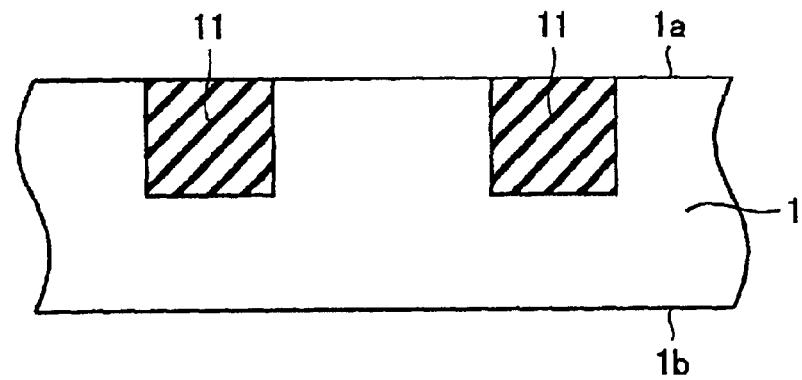

With reference to FIG. 7, an insulator 11 is embedded into trench 13.

Figure 8:
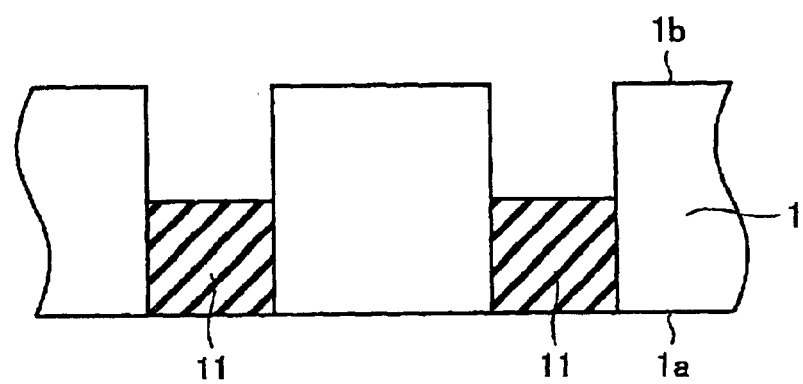
Figure 9:
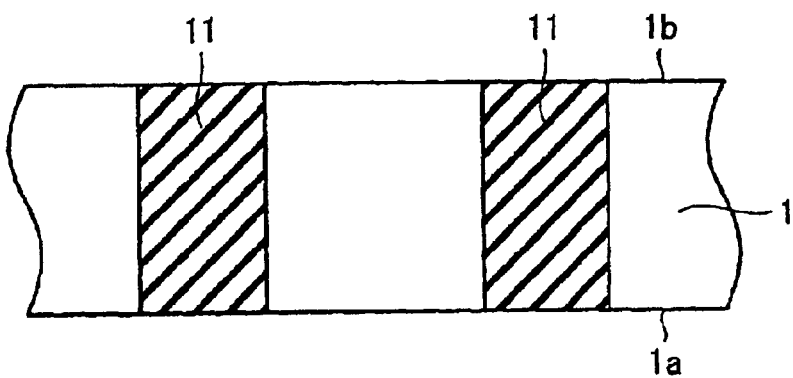

In reference to FIG. 8, the portion for forming the trench of silicon substrate 1 is excavated from an opposite side of the substrate until insulator 11 appears. With reference to FIG. 9, insulator 11 is further embedded into the excavated portion. With reference to FIG. 1, a transistor including a gate electrode 2, wires 3 and an insulating layer 4 are formed thereon, so that a high frequency silicon semiconductor device is completed.

Seventh Embodiment

Figure 10:
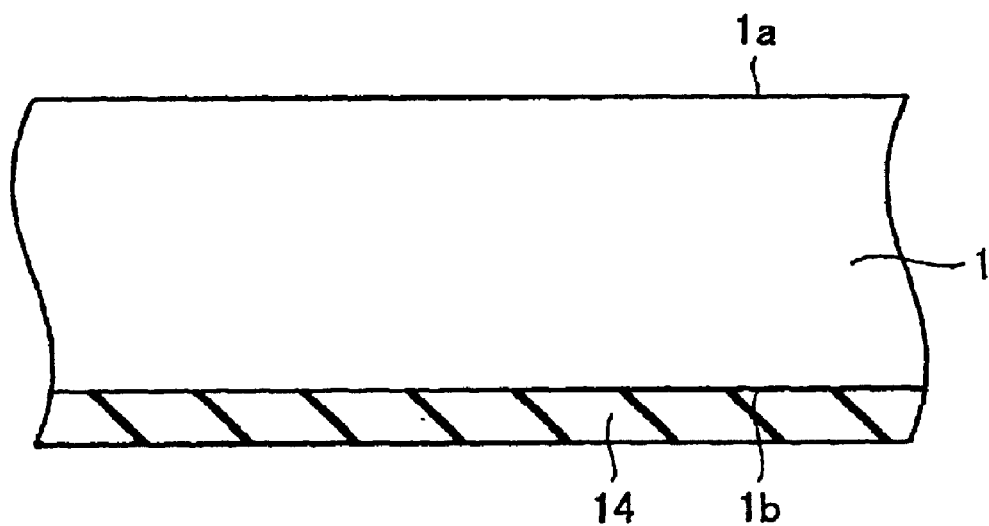
FIG. 10 is a sectional view of a semiconductor device from the first step of a method of manufacturing a high frequency silicon semiconductor device according to a seventh embodiment.
Figure 11:
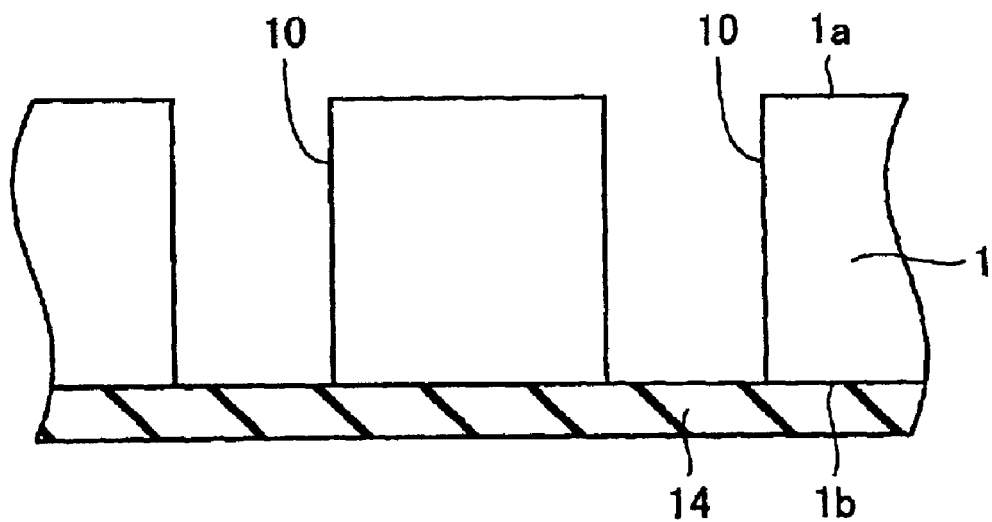
FIG. 11 is a sectional view of the semiconductor device from the second step of the method of manufacturing the high frequency silicon semiconductor device according to the seventh embodiment.
Figure 12:
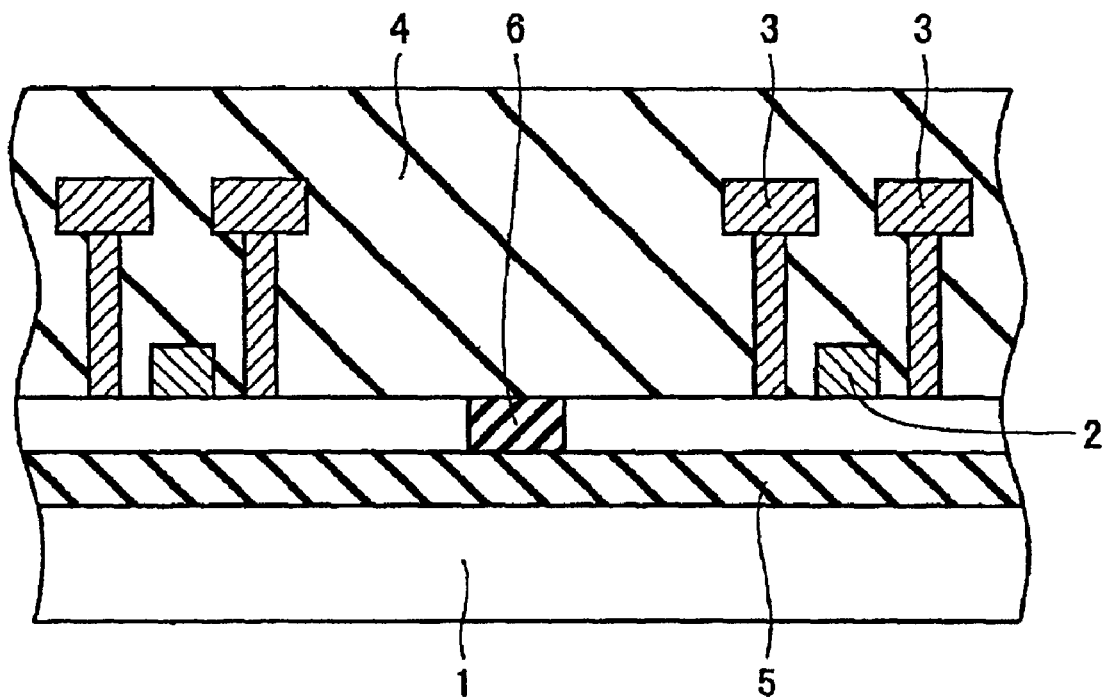
FIG. 12 is a sectional view of a conventional high frequency silicon semiconductor device.

FIGS. 10 and 11 are views for describing a manufacturing method of a high frequency silicon semiconductor device according to a seventh embodiment. With reference to FIG. 10, an insulator layer or a grounded metal layer 14 is formed on a back face of a silicon substrate 1.

With reference to FIG. 11, a portion for forming a trench of silicon substrate 1 is excavated from a surface of the substrate up to the back face of the substrate to form a penetrating trench 10. After that, an insulator is partially or fully embedded into penetrating trench 10 and a transistor and wires are formed, thereby obtaining the high frequency silicon semiconductor device shown in FIG. 1.

As described above, according to the present invention, an effect is realized that a high frequency silicon semiconductor device of which noise propagation is reduced is obtained at a price similar to that of the conventional silicon substrate.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device comprising;

a semiconductor substrate having a front surface and a back surface;

a trench, surrounding a region on the front surface of the semiconductor substrate and penetrating through the semiconductor substrate from the front surface to the rear surface, to suppress noise level in the region;

a semiconductor element in the semiconductor substrate at the front surface; and an insulating layer on the back surface of the semiconductor substrate.

2. The semiconductor device according to claim 1, comprising an insulator embedded in the first trench.

3. A semiconductor device comprising:

a semiconductor substrate having a front surface and a back surface;

a first trench, surrounding a region on the front surface of the semiconductor substrate and penetrating through the semiconductor substrate from the front surface to the rear surface, to suppress noise level in the region;

a semiconductor element in the semiconductor substrate at the front surface; and a second trench on the front surface of the semiconductor substrate and penetrating through the semiconductor substrate from the front surface to the back surface, the second trench surrounding the first trench.

4. A semiconductor device comprising:

a semiconductor substrate having a front surface and a back surface;

a trench transverse to the front surface, penetrating through the semiconductor substrate, and surrounding a region of the semiconductor substrate which is a noise generation source;

a semiconductor element on said semiconductor substrate; and an insulating layer on the back surface of the semiconductor substrate.

5. A semiconductor device comprising:

a semiconductor substrate having a front surface and a back surface;

a plurality of parallel trenches transverse to the front surface, penetrating through the semiconductor substrate, and surrounding a region of the semiconductor substrate which is a noise generation source; and a semiconductor element on said semiconductor substrate.

6. The semiconductor device according to claim 3, comprising an insulator embedded in the first trench.

7. The semiconductor device according to claim 4, comprising an insulator embedded in the trench.

8. The semiconductor device according to claim 5, comprising an insulator embedded in the trenches.

* * * * *